United States Patent [19]
Wartski et al.

[11] Patent Number: 5,637,150
[45] Date of Patent: Jun. 10, 1997

[54] DEVICE AND METHOD FOR FORMING A PLASMA BY APPLICATION OF MICROWAVES

[75] Inventors: Louis Wartski, Montrouge; Jean Aubert, Saint-Remy-les-Chevreuse, both of France

[73] Assignee: Plasmion, Orsay, France

[21] Appl. No.: 624,552
[22] PCT Filed: Oct. 4, 1994
[86] PCT No.: PCT/FR94/01155
 § 371 Date: May 23, 1996
 § 102(e) Date: May 23, 1996
[87] PCT Pub. No.: WO95/10169
 PCT Pub. Date: Apr. 13, 1995

[30] Foreign Application Priority Data
 Oct. 4, 1993 [FR] France ................................ 93 11785

[51] Int. Cl.$^6$ ................................................ C23C 16/00
[52] U.S. Cl. ........................ 118/723 AN; 118/723 MW; 427/575
[58] Field of Search .................... 118/723 MP, 723 MW, 118/723 MR, 723 ME, 723 MA, 723 AN; 427/575; 204/298.38; 156/345, 643.1; 216/69

[56] References Cited

U.S. PATENT DOCUMENTS

| 556,475 | 9/1896 | Besen et al. ........................ 118/723 MP |
| 5,079,481 | 1/1992 | Moslehi ........................ 315/111.41 |
| 5,082,517 | 1/1992 | Moslehi ........................ 156/345 |
| 5,522,343 | 6/1996 | Kodama et al. ................. 118/723 MP |
| 5,560,778 | 10/1996 | Park et al. .......................... 118/723 E |

FOREIGN PATENT DOCUMENTS

| 0 391 156 A2 | 10/1990 | European Pat. Off. . |
| 2-156526 | 6/1990 | Japan . |

OTHER PUBLICATIONS

Pichot et al. "Microwave multipolar plasmas excited by distributed electron cyclotron resonance: Concept and performance." *Review of Scientific Instruments*, vol. 59, No. 7, Jul. 1988, pp. 1072–1075.

Ngo Phong Linh et al. "Excitation of the Half-Frequency of the Input Signal in the Response of an Antenna." *IEEE Transactions on Plasma Science*, vol. 18, No. 4, Aug. 1990, pp. 717–724.

Farchi et al. "Optimization of a two-stages electrostatic reflex ion source." *Review of Scientific Instruments*, vol. 65, No. 4, Apr. 1994, pp. 1101–1103.

*Primary Examiner*—John Niebling
*Assistant Examiner*—Joni Y. Chang
*Attorney, Agent, or Firm*—Oliff & Berridge

[57] ABSTRACT

A device for forming a microwave plasma including an ionizing chamber wherein a gas can be introduced so as to undergo excitation induced by the presence of a high frequency alternating electric field produced by a plurality of metal antennas. The device includes a gas-free volume wherein metal antennas are arranged parallel to one another and are distributed at the nodes of a regular plane array, an end of each antenna extending from the gas-free volume in the ionizing chamber and an induction loop producing microwaves in the gas-free volume.

9 Claims, 1 Drawing Sheet

DEVICE AND METHOD FOR FORMING A PLASMA BY APPLICATION OF MICROWAVES

BACKGROUND OF THE INVENTION

The present invention relates to a device and a method for forming a plasma by application of microwaves.

It is known that, in order to create a plasma, a volume of gas can be subjected to high-frequency excitation by an alternating electrical field, possibly in combination with a static magnetic field.

This superimposition of an alternating electrical field on a static magnetic field causes a cyclotron electron resonance effect, providing optimal conditions for gas ionization.

In practice, a plasma is created from a gas volume by placing the gas volume in a high-frequency alternating electrical field generated by a metal antenna on which a static magnetic field may be superimposed.

SUMMARY OF THE INVENTION

The goal of the invention is to provide a new device for forming a plasma that which is large in dimension and of any shape, particularly one with a rectangular or circular cross section.

The present invention relates to a device for forming a plasma from microwaves, comprising an ionization chamber into which a gas can be introduced to undergo excitation due to the presence of a high-frequency alternating electrical field emitted by a plurality of metal antennas, characterized in that it includes a gas-free volume wherein said metal antennas are disposed parallel to each other, distributed at the nodes of a regular plane network, one end of each antenna extending outside said gas-free volume in the ionization chamber, with an induction loop emitting microwaves in the gas-free volume.

According to the invention, only the ends of the antennas are immersed in the microwave plasma from which the ion beam is extracted.

The advantage of this device is that the plasma, which occupies a small volume by comparison to the total volume, has little effect on the excitation conditions of the latter.

In addition, the microwave energy is supplied through an induction loops to the periodic structure at a single point in the volume containing the antennas.

According to the invention, "induction loop" is understood to be any means that can supply the microwave energy to the periodic structure. In particular, it is an associated antenna.

With this principle, highly varied devices can be built depending on the positions of the antennas distributed in two dimensions; however their length is, according to the invention, approximately an odd multiple of half the wavelength of the microwave in vacuum.

The emissive surface of the plasma, and hence the shape of the extracted-ion beam cross section, may be chosen for application to numerous industrial applications, particularly surface treatment by ion beams.

In one particular embodiment of the invention, the device also has means for generating a polarization electrical field in the gas-free volume, which field is able to concentrate the ions formed in the vicinity of the array of metal antennas.

Advantageously, the means for generating the polarization electrical field include the array of metal antennas serving for application of microwaves in the plasma.

The present invention also relates to a process for forming a plasma from microwaves in a device as described above, characterized in that there is added, to the excitation electrical field, another quasi-static polarization electrical field which tends to concentrate the ions around each of the microwave-emitting antennas. In plasma theory, this concentration of ions is designated "ion sheath."

In other words, the method according to the invention consists of adding, to the electrical and magnetic excitation fields, another and quasi-static polarization electrical field which forms an ion sheath around the array of microwave-emitting antennas.

This ion sheath behaves like an electrical capacitance that offsets the self-inductive component of the antenna, which self-inductive component appears naturally when the plasma is subjected to the microwaves, principally under the conditions of cyclotron electron resonance.

In one embodiment of the invention, the polarization field is emitted by the array of metal antennas, with a polarization voltage being applied directly to said antenna array.

In one preferred variant, self-polarization of the antennas is created by interposing an electrical resistance between the walls of the ionization chamber and an electrically conducting base common to the array of antennas.

With the goal of better communicating the invention, one embodiment taken as a nonlimiting example will now be described with reference to the attached drawing wherein:

DETAILED DESCRIPTION OF PREFERRED EMBODIMENTS

Figure 1:
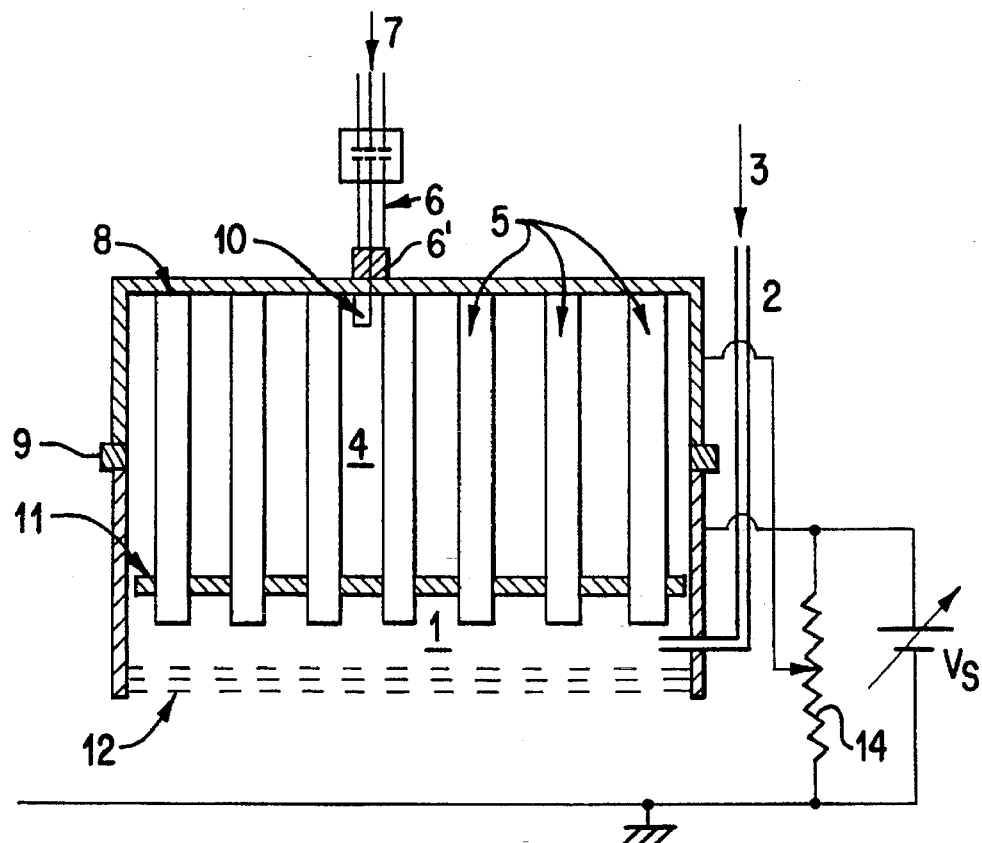
FIG. 1 represents schematically in cross section an ionization chamber according to the invention.

FIG. 1 illustrates schematically an ionization chamber 1, which, according to the invention, has a large-dimensioned parallelepipedic shape, inside which a gas can be introduced through a pipe 2 as indicated by arrow 3.

Inside chamber 4, an array of metal antennas 5, which in this case are shaped like cylindrical bars, emits alternating waves at a very high frequency coming from a generator not shown and brought to antenna array 5 by a coaxial cable 6 as indicated by arrow 7.

The antennas in array 5 are disposed according to spatial periodicity, namely at the nodes of a regular plane network, and are connected with each other electrically by a cover 8 on which microwave feed connector 6' is also mounted.

Input cover 8 is insulated from the rest of the wall of the device by an insulator 9. The separation between these two parts is located at a point where the microwave current circulating on the inner walls is practically zero, rendering the perturbation thus obtained negligible.

In the case of a microwave with a frequency of 2.45 Hz, the insulating material is thus at a distance of $\lambda/4 \cong 3$ cm from the base of the bars, whose length is approximately $k\lambda/4 \cong$ (k is odd), here k=3 and $k\lambda/4 \cong 9$ cm.

Cover 8 to which the antennas are attached receives the input coaxial connector 6' designed to transmit the microwave energy to the periodic antenna structure. This connector 6' ends in an induction loop 10 which couples the microwave energy to the periodic antenna structure.

A dielectric plate 11 retains the free end of the branches of the antennas constituting array 5, while leaving a large plasma-free volume 4.

An alternating electrical field becomes established between antenna array 5 and a collector grid 12 located opposite antennas 5.

Permanent magnets 13 generate a static magnetic field $\vec{B}$ which is superimposed on the alternating electrical field $\vec{E}$ generated by antenna array 5.

Figure 2:
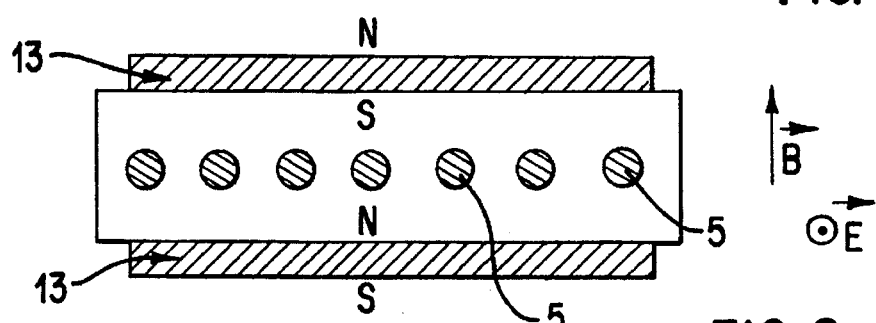
FIG. 2 is a cross section of one embodiment of the antenna array according to the invention.

FIG. 2 shows the presence of permanent magnet bars 13, parallelepipedic in shape, located on either side of the ionization chamber and producing a transverse static magnetic field $\vec{B}$ in the direction parallel to the small dimension of the chamber.

The gas that penetrates ionization chamber 1 is subjected to high-frequency excitation combined with a magnetic field, which causes it to ionize under the desired conditions.

A polarization voltage is also applied to antenna array 5 by a generator $V_s$. This polarization voltage causes formation, around antenna array 5, of an ion sheath which constitutes the equivalent of an electrical capacitance.

A system that is easy to implement is self-polarization of the antennas by an adjustable electrical resistance 14 placed between antenna array 5 and the walls of the ionization chamber.

Figure 3:
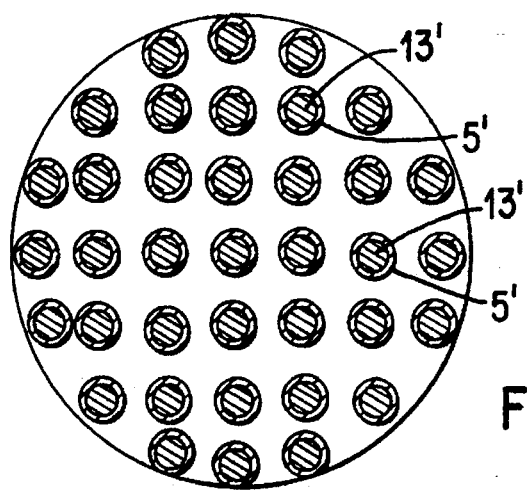
FIG. 3 is a cross section of another embodiment of the antenna array according to the invention.

In FIG. 3, the volume containing antenna array 5' is circular in section.

In this configuration, the static magnetic field is created by permanent magnets 13' in the shape of bars with axial power supply, said magnets being accommodated inside metal antennas 5' themselves, in the form of hollow tubes.

It should be understood that the embodiments described hereinabove are not limiting in nature and that they may receive any desirable modifications without thereby departing from the framework of the invention.

We claim:

1. A device for forming a plasma from microwaves comprising an ionization chamber including a gas-free volume into which a gas can be introduced to undergo excitation due to the presence of a high-frequency alternating electrical field emitted by a plurality of metal antennas disposed in said ionization chamber, wherein said metal antennas are disposed parallel to each other and distributed at nodes of a regular plane network, one end of each antenna extending outside said gas-free volume in the ionization chamber, with at least one induction loop emitting microwaves into the gas-free volume.

2. The device according to claim 1, wherein said microwaves have a wavelength and a length of the metal antenna is approximately an odd multiple of a quarter of the wavelength of the microwaves in a vacuum.

3. The device according to claim 1, further comprising means for generating a polarization electrical field in the gas-free volume, wherein the field is able to concentrate ions formed in the vicinity of the metal antennas as an ion sheath.

4. The device according to claim 3, wherein the means for generating the polarization electrical field includes the metal antennas that serve to apply the microwaves in the plasma.

5. The device according to claim 1, further comprising a single induction loop for application of the microwaves in the gas-free volume.

6. The device according to claim 1, further comprising permanent magnets able to generate a static magnetic field in the ionization chamber.

7. The device according to claim 6, wherein the metal antennas comprise hollow tubes and the permanent magnets are placed inside the metal antennas and the permanent magnets comprise axially supplied bars.

8. A method of forming plasma for microwaves comprising using a device for forming a plasma from microwaves comprising an ionization chamber including a gas-free volume into which a gas can be introduced to undergo excitation due to the presence of a high-frequency alternating electrical field emitted by a plurality of metal antennas disposed in said ionization chamber, wherein said metal antennas are disposed parallel to each other and distributed at nodes of a regular plane network, one end of each antenna extending outside said gas-free volume in the ionization chamber, with at least one induction loop emitting microwaves into the gas-free volume.

9. The method according to claim 8, further comprising adding a quasi-static polarization electrical field to the electrical field to concentrate ions around each of the metal antennas.

* * * * *